(12) United States Patent
Cankurt et al.

(10) Patent No.: US 11,381,179 B2
(45) Date of Patent: Jul. 5, 2022

(54) METHOD OF GENERATING A CONTROLLABLE ELECTROSTATIC ATTRACTION FORCE BETWEEN TWO OBJECTS AND PROVIDING ADHESION WITH THIS ATTRACTION FORCE

(71) Applicant: HIDROPAR HAREKET KONTROL TEKNOLOJILERI MERKEZI SANAYI VE TICARET ANONIM SIRKETI, Kocaeli (AR)

(72) Inventors: Tolga Cankurt, Kocaeli (TR); Serhat Demirtas, Istanbul (TR); Evren Samur, Istanbul (TR)

(73) Assignee: HIDROPAR HAREKET KONTROL TEKNOLOJILERI MERKEZI SANAYI VE TICARET ANONIM SIRKETI, Kocaeli (TR)

( * ) Notice: Subject to any disclaimer, the term of this patent is extended or adjusted under 35 U.S.C. 154(b) by 0 days.

(21) Appl. No.: 17/055,136

(22) PCT Filed: Apr. 10, 2020

(86) PCT No.: PCT/TR2020/050305
§ 371 (c)(1),
(2) Date: Nov. 13, 2020

(87) PCT Pub. No.: WO2020/214120
PCT Pub. Date: Oct. 22, 2020

(65) Prior Publication Data
US 2021/0226562 A1    Jul. 22, 2021

(30) Foreign Application Priority Data
Apr. 16, 2019 (TR) .................. 2019/05624

(51) Int. Cl.
*H02N 13/00* (2006.01)
*B03C 7/02* (2006.01)
(Continued)

(52) U.S. Cl.
CPC ............... *H02N 13/00* (2013.01); *B03C 7/02* (2013.01); *H01L 21/6833* (2013.01); *H01L 21/67109* (2013.01); *H01L 21/683* (2013.01)

(58) Field of Classification Search
CPC ....... H02N 13/00; B03C 7/02; H01L 21/6833; H01L 21/6732; H01L 21/683;
(Continued)

(56) References Cited

U.S. PATENT DOCUMENTS

| 6,113,768 A | 9/2000 | Fuhr et al. |
| 2008/0089002 A1 | 4/2008 | Pelrine et al. |

(Continued)

FOREIGN PATENT DOCUMENTS

WO    2015094375 A1    6/2015

*Primary Examiner* — Danny Nguyen
(74) *Attorney, Agent, or Firm* — Bayramoglu Law Offices LLC

(57) ABSTRACT

A method of generating an electrostatic attraction force includes an application of an insulating surface, wherein the insulating surface separates electrode arrays and the electrode arrays positioned in at least two different axes and providing an adhesion with an help of the electrostatic attraction force, wherein a matrix array is formed for an electrostatic attraction force region to provide gravity to at least one of objects, at a desired point and a number of electrodes is generated by feeding with a DC voltage and/or an AC voltage at desired points and at a desired force, wherein at least two objects adhere with the electrostatic attraction force.

2 Claims, 6 Drawing Sheets

(51) Int. Cl.
  *H01L 21/683*    (2006.01)
  *H01L 21/67*    (2006.01)

(58) Field of Classification Search
  CPC . H01L 21/67; H01L 21/67109; H01L 21/687;
        H01L 21/50; B25J 15/00; B25J 15/0085;
                              B25J 15/0066
  USPC ........................................................ 361/234
  See application file for complete search history.

(56)     References Cited

U.S. PATENT DOCUMENTS

| | | |
|---|---|---|
| 2008/0211341 A1 | 9/2008 | Pelrine et al. |
| 2010/0027187 A1 | 2/2010 | Pelrine et al. |
| 2011/0193362 A1 | 8/2011 | Prahlad et al. |
| 2012/0087058 A1* | 4/2012 | Hansen ................... G03F 7/703 |
| | | 361/234 |
| 2012/0120544 A1 | 5/2012 | Pelrine et al. |
| 2012/0134065 A1* | 5/2012 | Furuya ................ H01L 21/6833 |
| | | 361/234 |
| 2013/0242455 A1 | 9/2013 | Prahlad et al. |
| 2013/0292303 A1 | 11/2013 | Prahlad et al. |
| 2014/0104744 A1* | 4/2014 | Prahlad ................. H02N 13/00 |
| | | 361/234 |
| 2014/0133062 A1 | 5/2014 | Prahlad et al. |
| 2015/0298320 A1* | 10/2015 | Eisele .................. B25J 15/0071 |
| | | 294/24 |
| 2016/0056734 A1 | 2/2016 | Spicer et al. |
| 2016/0196997 A1* | 7/2016 | White ....................... F27B 1/08 |
| | | 361/234 |
| 2017/0269686 A1 | 9/2017 | Khoshkava et al. |
| 2019/0013746 A1 | 1/2019 | Heinz |

* cited by examiner

METHOD OF GENERATING A CONTROLLABLE ELECTROSTATIC ATTRACTION FORCE BETWEEN TWO OBJECTS AND PROVIDING ADHESION WITH THIS ATTRACTION FORCE

CROSS-REFERENCE TO RELATED APPLICATIONS

This application is the national stage entry of International Application No. PCT/TR2020/050305, filed on Apr. 10, 2020, which is based upon and claims priority to Turkish Patent Application No. 2019/05624, filed on Apr. 16, 2019, the entire contents of which are incorporated herein by reference.

TECHNICAL FIELD

The present invention relates to the method of generating a controllable electrostatic attraction force between two objects and providing adhesion with this attraction force.

BACKGROUND

Electrostatic adhesion or grip is generally generating an electrostatic attraction force between two objects, and with this electrostatic attraction force, providing adhesion and grip between the two objects.

There are already systems that have one or more electrodes and that provide adhesion of these electrodes with electrostatic attraction force by electrification of them.

Examples include "Electroadhesion" numbered US2008089002, "Electroadhesion" numbered US2010027187, "Electroadhesive grip" numbered US2011193362, "Electrodesy grip and manipulation" numbered US2013242455, "Electroadhesion providing additional power" numbered US2014133062, "Compatible electroadhesion grip system" numbered US2014104744, "Material retention and sequencing using electroadhesion" numbered US2013292303, "Compatible electroadhesion holding device" numbered US2016056734, "Electrostatic adhesive based haptic exit device" numbered US2017269686, "Electroadhesion devices" numbered US2012120544 and "Modular electroadhesion grip system" numbered WO2015094375.

In present systems, generating electrostatic attraction force independent from each other at more than one point is possible only by multiplying existing products. As this system, which is obtained by using the products side by side in the present art, brings with it many technical limitations, the number of independent controllable regions cannot be increased with this method due to physical and technical reasons and this limits the number of regions that can be generated.

For this reason, it is not possible to generate a desired number of electrostatic attraction force regions on the surface in the existing structures and methods, and to obtain adhesion based on the electrostatic attraction force at the desired force in these regions.

SUMMARY

The object of the present invention is to provide an electrostatic attraction force and adhesion based on this force at desired points or regions and at the desired force by means of electrode arrays in matrix form on at least two different axes and by activating the desired number of electrodes.

REFERENCES IN THE DRAWINGS

Figure 1:
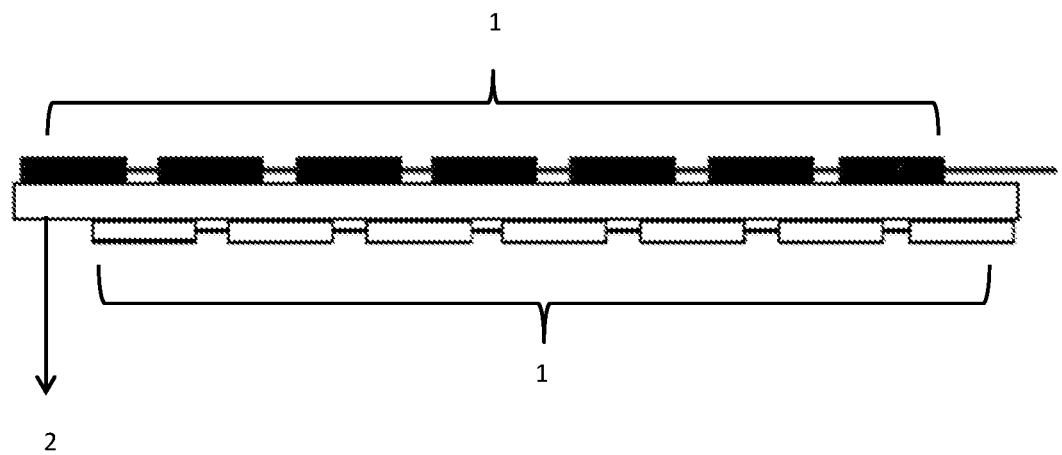
FIG. 1. The view of an object capable of generating electrostatic attraction force.

1. Electrode array
   X. X axis electrode array
   Y. Y axis electrode array
2. Insulating surface
3. Electrostatic attraction force region
4. Undesired region
5. The object that can generate electrostatic attraction force
6. The object to be gripped
   v. Voltage
   t. Time

BRIEF DESCRIPTION OF THE EMBODIMENTS

The method of the present invention relates to generating a multi-regional controllable electrostatic attraction force on the objects so that the adhesion properties of the objects can be changed independently, positioning electrode arrays (1) positioned in the form of a matrix array in at least two axes to generate a attraction force at the points where they intersect, by feeding them with DC and/or AC voltage to ensure that they have multi-regional adhesion surfaces and applying an insulating surface (2) that separates the electrode arrays (1) from each other.

Electrode arrays (1) are positioned in the form of a matrix array on the surface where the electrostatic attraction force is desired to be provided. With this matrix array, an electrostatic attraction force can be generated at the desired points on the surface of the object (5), which can generate electrostatic attraction force.

Therefore, electrodes arrays (1) are arranged on at least two axes to objects (5) that can generate electrostatic attraction force. The electrode arrays (1) are separated from each other by the insulating surface (2).

In the figures, the shapes of the electrodes in the electrode arrays (1) are given as examples, and the electrode shapes and arrays may vary depending on the electrostatic attraction force to be generated.

In objects (5) capable of generating gravity, the electrode arrays (1) corresponding to the regions where electrostatic attraction force is desired to be generated are fed with DC and/or AC voltage and electrostatic attraction force region (3) is generated at the intersections of electrode arrays (1) fed by DC and/or AC voltage.

Figure 2:
FIG. 2. The view of adhesion of the other object to the object that can generate electrostatic attraction force.
Figure 3:
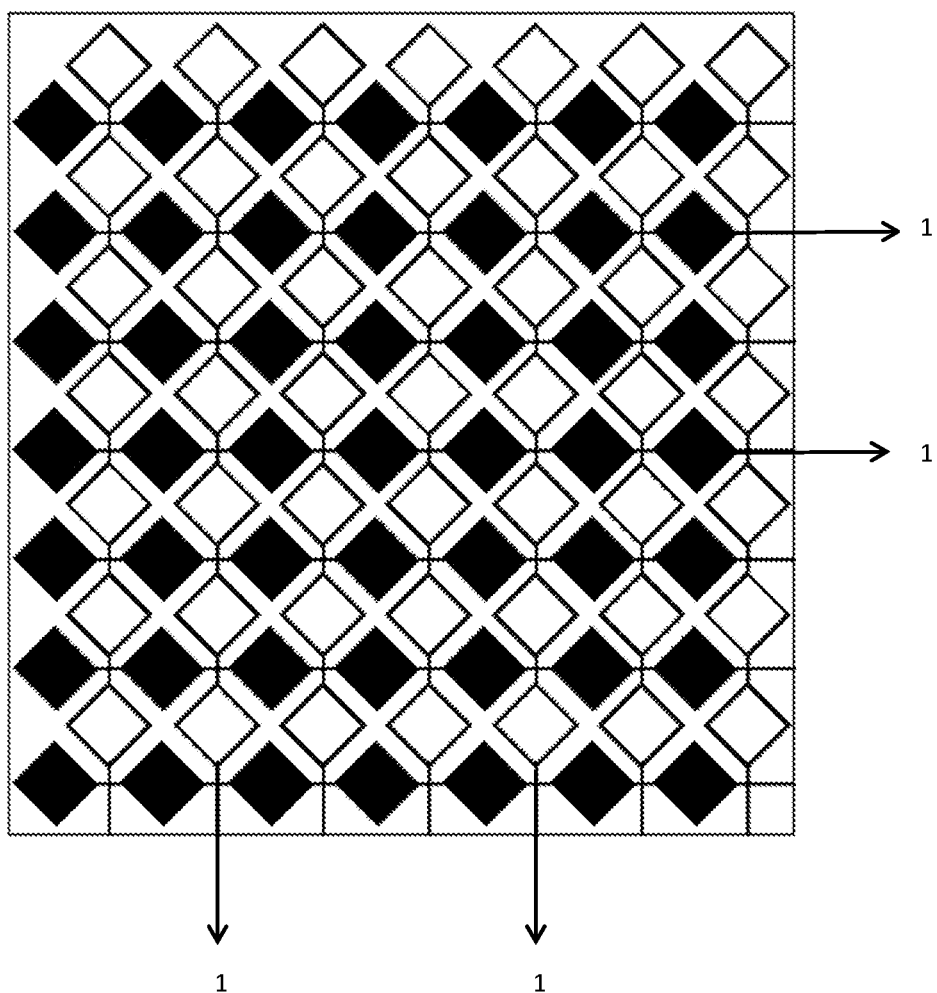
FIG. 3. View of the electrode array.

In FIG. 2, it is shown that the object (6) to be gripped thanks to the electrostatic attraction force generated by the method of the invention adheres to the object (5) where the electrostatic attraction force is generated.

Figure 4:
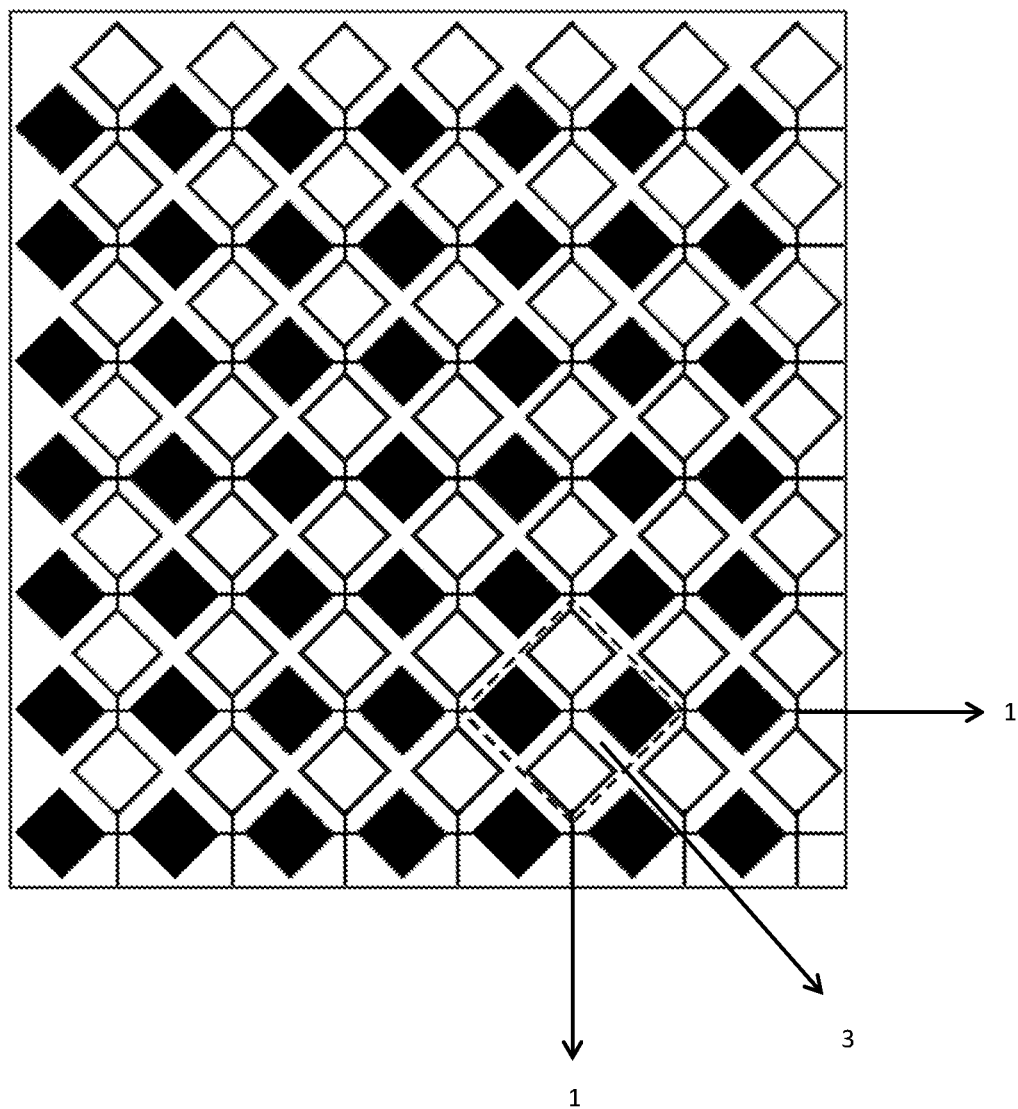
FIG. 4. The view of the generation of the electrostatic attraction force region.

For example, as shown in FIG. 4, electrostatic attraction force region (3) can be generated in the desired region on the object (5), on which electrostatic attraction force can be generated by feeding the desired electrode arrays (1) with high voltage. Thus, the object (6) to be gripped is adhered to the object (5) on which the electrostatic attraction force can be generated in the region of the generated electrostatic attraction force (3).

Thus, multi-regional controllable electrostatic attraction force is generated by expanding and/or increasing the number of the electrostatic attraction force regions (3) on the objects (5) that can generate electrostatic attraction force as desired. Also, it can be provided that the objects (6) to be gripped can adhere independently.

Said object (5) on which electrostatic attraction force can be generated may be equipment such as robotic and mechanical grippers, conveyor belts, wheels, pallets, etc. The method of the present invention is also used on the surfaces of these vehicles, so that they can have adhesion properties depending on the electrostatic attraction force, whose location and strength can be controlled locally.

The method of generating the electrostatic attraction force and providing adhesion with this attraction force of the invention comprises the following process steps;

determining the location, number and attraction force of the attraction force regions (3) to be generated for the object (5) on which electrostatic attraction force can be generated, applying the electrode arrays (1) to the object (5) on which electrostatic attraction force can be generated in at least two different axes to the determined electrostatic attraction force region (3) so that the suitable electrode matrix is generated, applying an insulating surface (2) to the object (5), on which electrostatic attraction force can be generated so that the electrode arrays (1) in different axes are separated, feeding the electrode arrays (1) corresponding to the determined electrostatic attraction force region (3) with high DC and/or AC voltage, generating an electrostatic attraction at the intersections of electrode arrays (1) fed with high DC and/or AC voltage.

The method of generating the electrostatic attraction force and providing adhesion with this attraction force may also comprise applying a suitable elastomer coating to the external structure of the object (5) on which electrostatic attraction force can be generated. Thus, the object (5), on which electrostatic attraction force can be generated, may also adapt to the shape of the object (6) to be gripped and cover it, and have the shape-based holding feature. The elastomer coating application also allows the generating more surface area to the object (5) on which electrostatic attraction force can be generated.

In an example of the present invention, the X axis electrode array (X) is applied to the X axis and the Y axis electrode array (Y) is applied to the Y axis.

Figure 5:
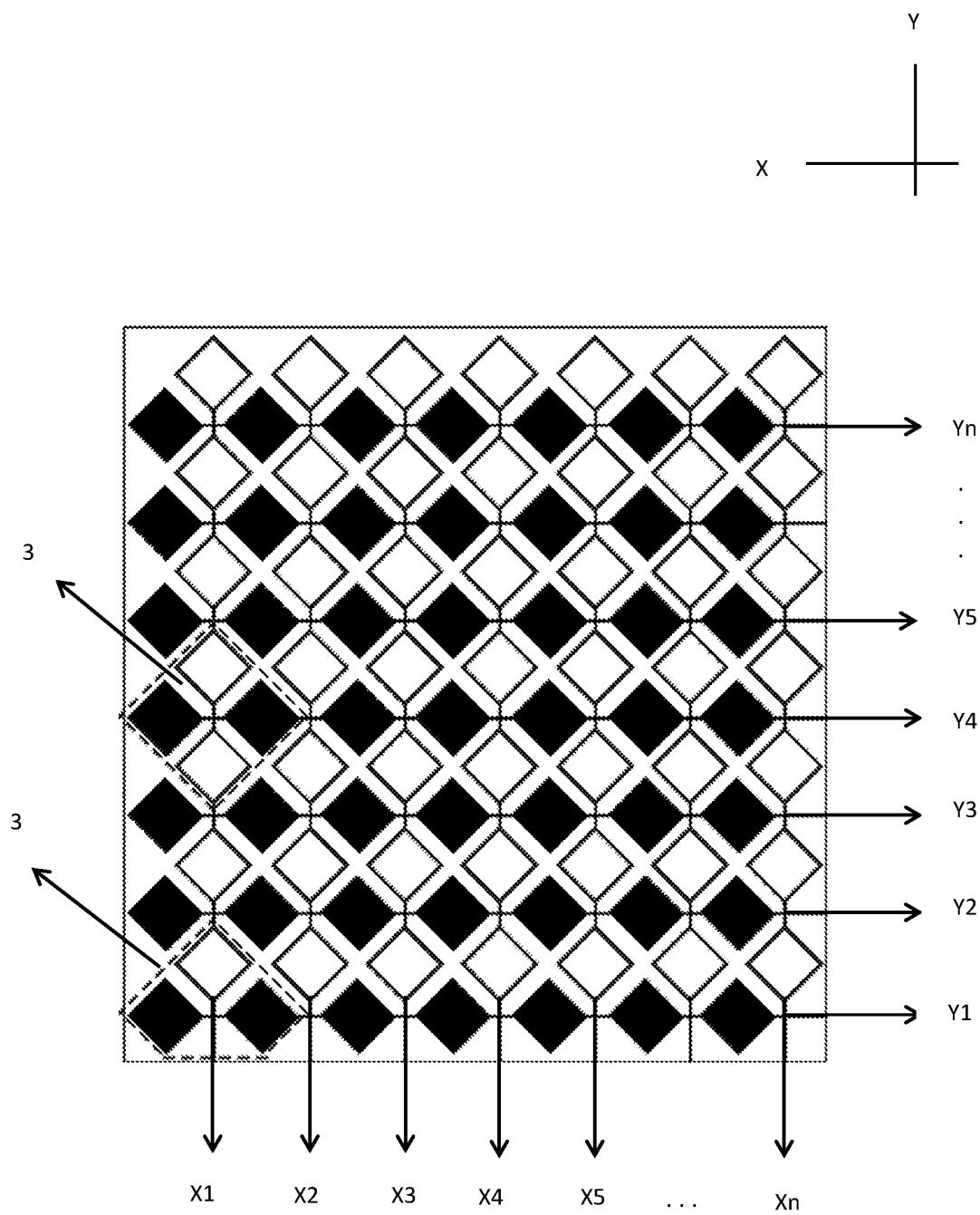
FIG. 5. The view of the generation of more than one electrostatic attraction force region.

As shown in FIG. 5, the X axis electrode array (X) can be applied up to X1, X2, X3 . . . Xn and the Y axis electrode array (Y) can be applied up to Y1, Y2, Y3 . . . Yn.

Those determined from the X axis electrode arrays (X) and the Y axis electrode arrays (Y) are fed with high DC and/or AC voltage to generate an electrostatic attraction force region (3) at the desired point on the object (5) on which the electrostatic attraction force can be generated.

In FIG. 5, two electrostatic attraction force regions (3) generated in the region where the X1-Y1 electrode array intersects and in the region where the X1-Y4 electrode array intersects as a result of feeding the X1, Y1 and Y4 electrode arrays (1) with high DC and/or AC voltage.

Thanks to the multiple electrostatic attraction force regions (3) generated by the method, it is provided that more than one objects to be gripped can adhere to the object (5), on which electrostatic attraction force can be generated, independently each other.

However, in this case, undesired regions (4) may be formed. In order to prevent the said undesired region (4) from forming, the time shifting method included in the method of the present invention can be applied. In the time shifting method which will be carried out at high frequency, the formation of the undesired region (4) can be prevented by preventing the electrodes corresponding to the undesired region (4) to be active at the same time can be prevented by time shifting.

Figure 6:
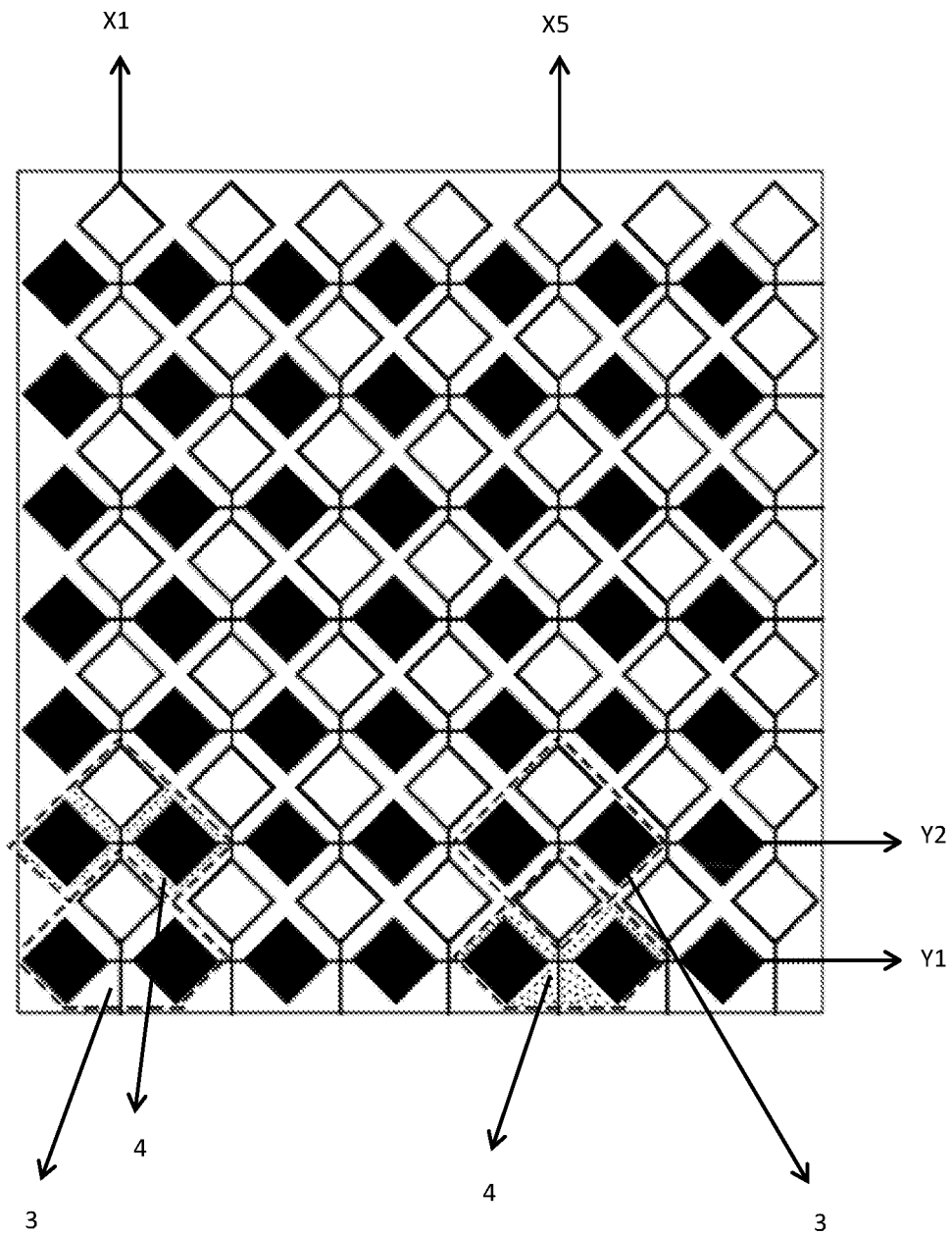
FIG. 6. The view of the formation of an undesired region.
Figure 7:
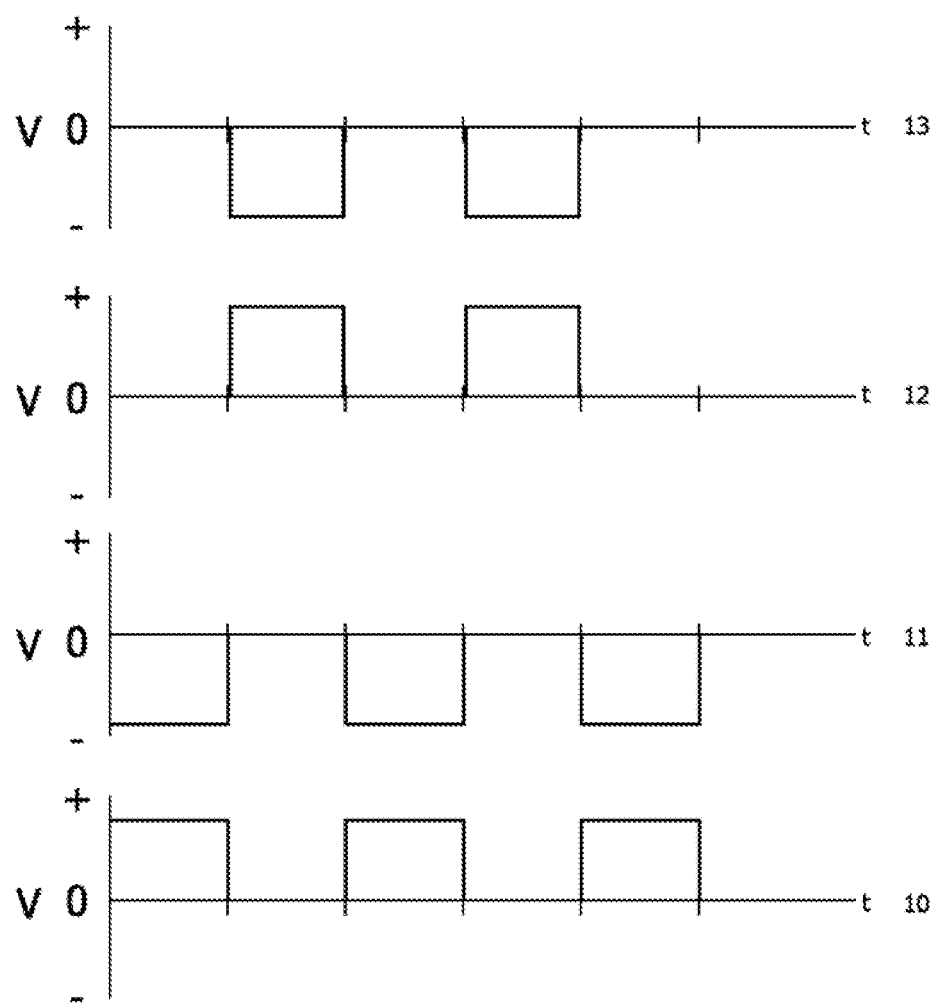
FIG. 7. Time shift scheme.

It is possible to prevent the undesired regions (4) formed when the X1-Y1 and X5-Y2 electrode arrays are active, which are seen in FIG. 6, by the said time shifting method. The time shift method is shown in FIG. 7.

With the method of the present invention, the tools having adhesion property depending on the electrostatic attraction force are provided the feature of multi-regional controllable electrostatic attraction force region (3). With this feature, these tools are provided with multi-regional adhesion surfaces that can be changed independently.

What is claimed is:

1. A method of generating a controllable electrostatic attraction force and providing an adhesion with the controllable electrostatic attraction force, the method comprising:

generating a multi-regional controllable electrostatic attraction force on objects, wherein adhesion properties of the objects are changed independently, positioning electrode arrays in a form of a matrix array in at least two axes to generate the controllable electrostatic attraction force at points where the electrode arrays intersect, by feeding the electrode arrays with a DC voltage and/or an AC voltage to ensure the electrode arrays have multi-regional adhesion surfaces, applying an insulating surface, wherein the insulating surface separates the electrode arrays from each other;

determining a location, a number and an attraction force of attraction force regions to be generated for the objects, wherein the multi-regional controllable electrostatic attraction force is generated on the objects, applying the electrode arrays to the object on which electrostatic attraction force can be generated in at least two different axes so that an electrode matrix for the determined electrostatic attraction force regions is generated, applying the insulating surface to the objects, wherein the multi-regional controllable electrostatic attraction force is generated on the objects, wherein the electrode arrays in the at least two different axes are separated, feeding the electrode arrays corresponding to the determined electrostatic attraction force regions with the DC voltage and/or the AC voltage, and generating an electrostatic attraction at intersections of the electrode arrays fed with the DC voltage and/or the AC voltage.

2. The method of generating the controllable electrostatic attraction force and providing the adhesion with the controllable electrostatic attraction force according to claim 1, wherein the method comprises the object, on which electrostatic attraction force can be generated may also adapt to a shape of the object to be gripped by applying an elastomer coating to the object, on which electrostatic attraction force can be generated, increasing the surface area.

* * * * *